United States Patent
Saito

(12) United States Patent (10) Patent No.: US 7,928,580 B2
Saito (45) Date of Patent: Apr. 19, 2011

(54) SEMICONDUCTOR MEMORY DEVICE HAVING WIRING WITH LEAD PORTIONS DISPOSED WITH A PITCH LARGER THAN PITCH OF PARALLEL BIT LINES

(75) Inventor: Kazuo Saito, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 381 days.

(21) Appl. No.: 11/756,016

(22) Filed: May 31, 2007

(65) Prior Publication Data

US 2007/0278559 A1 Dec. 6, 2007

(30) Foreign Application Priority Data

May 31, 2006 (JP) .................................. 2006-151539

(51) Int. Cl.
*H01L 23/48* (2006.01)
*H01L 23/52* (2006.01)

(52) U.S. Cl. ... 257/775; 257/773; 257/784; 257/E23.01; 257/E23.141

(58) Field of Classification Search .................. 257/773, 257/775, 784, E23.01, E23.141
See application file for complete search history.

(56) References Cited

U.S. PATENT DOCUMENTS 5,208,782 A * 5/1993 Sakuta et al. ............ 365/230.03
2006/0038292 A1 2/2006 Minami et al.

FOREIGN PATENT DOCUMENTS

| JP | 2000-22895 | 1/2000 |
| JP | 2000-76880 | 3/2000 |
| JP | 2006-60133 | 3/2006 |

OTHER PUBLICATIONS

U.S. Appl. No. 11/842,615, filed Aug. 21, 2007, Futatsuyama.

* cited by examiner

*Primary Examiner* — Anh Phung
*Assistant Examiner* — Allison P Bernstein
(74) *Attorney, Agent, or Firm* — Oblon, Spivak, McClelland, Maier & Neustadt, L.L.P.

(57) ABSTRACT

A semiconductor memory device includes a first wiring region and a second wiring region located adjacent to the first wiring region. First lines located in the first wiring region include a first portion, a first lead portion and first inclined portion. Second lines located in the second wiring region include a second portion, a second lead portion and a second inclined portion. The first and second portions are located in parallel with a same pitch, the first and second lead portions are located with a pitch which is larger than the pitch of the first and second portions, the first and second inclined portions extend the same direction at a predetermined angle.

8 Claims, 6 Drawing Sheets

SEMICONDUCTOR MEMORY DEVICE HAVING WIRING WITH LEAD PORTIONS DISPOSED WITH A PITCH LARGER THAN PITCH OF PARALLEL BIT LINES

CROSS-REFERENCE TO RELATED APPLICATIONS

This application is based upon and claims the benefit of priority from prior Japanese Patent Application No. 2006-151539, filed May 31, 2006, the entire contents of which are incorporated herein by reference.

BACKGROUND OF THE INVENTION

1. Field of the Invention

The present invention relates to a semiconductor memory device, and in particular, to a wiring (conductive line) layout pattern structure.

2. Description of the Related Art

A semiconductor memory device, for example, NAND-type flash memory is mainly composed of memory cell array and peripheral circuit arranged at the peripheral portion of the memory cell array.

The memory cell array and sense amplifier circuit and row decoder circuit forming the peripheral circuit are connected via a bit line or word line (e.g., refer to Jpn. Pat. Appln. KOKAI Publication No. 2006-60133).

For example, a line pitch of a bit line led from the memory cell array is reduced because of high integration of the memory cell array. On the other hand, a design rule is gently designed in the peripheral circuit. Therefore, a line pitch of the bit line led from the peripheral circuit is increased.

For this reason, the bit line has the following structure. Namely, the line pitch is increased using a lead portion while extending from the memory cell array toward the sense amplifier circuit.

In general, a wiring pattern of the bit line is formed on a chip in the following manner. The wiring pattern has a wiring layout such that neighboring wiring regions achieves right and left symmetry. Then, the wiring pattern is formed on the chip based on a glass mask made via electron beam exposure.

The bit line is formed on the chip while the line pitch is converted. In this case, the wiring pattern is mainly designed based on linear wiring using rectangular electron beam shot (hereinafter, referred to as rectangular EB shot). However, for convenience of design, the wiring pattern is designed using inclined lines formed using triangular EB shot.

In the wiring layout achieving right and left symmetry, right and left symmetry lithography pattern must be used for the triangular shot. In this case, in neighboring wiring areas, an inclined line has a positional shift, and is variable due to dimensional difference. As a result, it is difficult to form a wiring pattern having full right and left symmetry. Moreover, the difference between right and left of the wiring pattern occurs, and thereby, stable drive characteristic of the memory cell array is not obtained.

Recently, with the scale-down of the memory cell array, variations of the wiring pattern on the glass mask must be considered. This is because the foregoing variations give an influence to the operation of a NAND-type flash memory.

BRIEF SUMMARY OF THE INVENTION

A semiconductor memory device of an aspect of the present invention comprises a semiconductor substrate including a first wiring region having a first memory cell array area and a first lead area located adjacent to the first memory cell array area, and a second wiring region located adjacent to the first wiring region, the second wiring region having a second memory cell array area located adjacent to the first memory cell array area and a second lead area located adjacent to the first lead area; a plurality of first lines located in the first wiring region, each first line located from the first memory cell array area to the first lead area, each first line including a first portion located in the first memory cell area, a first lead portion located in the first lead area and a first inclined portion located in the first lead area, the first inclined portion connecting the first portion and the first lead portion, respectively; and a plurality of second lines located in the second wiring region, each second line located from the second memory cell array area to the second lead area, each second line including a second portion located in the second memory cell area, a second lead portion located in the second lead area and a second inclined portion located in the second lead area, the second inclined portion connecting the second portion and the second lead portion, respectively, wherein the first portions are located in parallel with a first pitch, the second portions are located in parallel with a second pitch which is the same as the first pitch, the first lead portions are located with a third pitch which is larger than the first pitch, the second lead portions are located with a fourth pitch which is the same as third pitch, the first inclined portions extend in a first direction at a predetermined angle to the first portion, and the second inclined portions extend in a second direction which is the same as the first direction.

A semiconductor memory device of an aspect of the present invention comprises a semiconductor substrate including a first wiring region having a first memory cell array area and a first lead area located adjacent to the first memory cell array area, and a second wiring region located adjacent to the first wiring region, the second wiring region having a second memory cell array area located adjacent to the first memory cell array area and a second lead area located adjacent to the first lead area; a plurality of first lines located in the first wiring region, each first line located from the first memory cell array area to the first lead area, each first line including a first portion located in the first memory cell area, a first lead portion located in the first lead area and a first inclined portion located in the first lead area, the first inclined portion connecting the first portion and the first lead portion, respectively; and a plurality of second lines located in the second wiring region, each second line located from the second memory cell array area to the second lead area, each second line including a second portion located in the second memory cell area, a second lead portion located in the second lead area and a second inclined portion located in the second lead area, the second inclined portion connecting the second portion and the second lead portion, respectively, wherein the first portions are located in parallel and include a first width, the second portions are located in parallel and include a second width which is the same as the first width, the first lead portions include a third width which is larger than the first width, the second lead portions include a fourth width which is the same as the third width, the first inclined portions extend in a first direction at a predetermined angle to the first portion, and the second inclined portions extend in a second direction which is the same as the first direction.

A semiconductor memory device of an aspect of the present invention comprises a semiconductor substrate including a first wiring region having a first memory cell array area, a first lead area located adjacent to one side of the first memory cell array area and a second lead area located adjacent to the other side of the first memory cell array area, and a second wiring region located adjacent to the first wiring region, the second wiring region having a second memory cell array area located adjacent to the first memory cell array area, a third lead area located adjacent to the first lead area and a fourth lead area adjacent to the second lead area; a plurality of first lines located in the first wiring region, each first line located from the first memory cell array area to the first lead area, each first line including a first portion located in the first memory cell area, a first lead portion located in the first lead area and a first inclined portion located in the first lead area, the first inclined portion connecting the first portion and the first lead portion, respectively; a plurality of second lines located in the first wiring region, each second line located from the first memory cell array area to the second lead area, each second line including a second portion located in the first memory cell array area, a second lead portion located in the second lead area and a second inclined portion located in the second lead area, the second inclined portion connecting the second portion and the second lead portion, respectively; a plurality of third lines located in the second wiring region, each third line located from the second memory cell array area to the third lead area, each third line including a third portion located in the second memory cell area, a third lead portion located in the third lead area and a third inclined portion located in the third lead area, the third inclined portion connecting the third portion and the third lead portion, respectively; and a plurality of fourth lines located in the second wiring region, each fourth line located from the second memory cell array area to the fourth lead area, each fourth line including a fourth portion located in the second memory cell area, a fourth lead portion located in the fourth lead area and a fourth inclined portion located in the fourth lead area, the fourth inclined portion connecting the fourth portion and the fourth lead portion, respectively; wherein the first, second, third and fourth portions are located in parallel with a first pitch, the first lead, second lead, third lead and fourth lead portions are located with a second pitch, and the first inclined, second inclined, third inclined and fourth inclined portion extend in a predetermined direction at a predetermined angle to the first portion.

DETAILED DESCRIPTION OF THE INVENTION

1. Outline

The semiconductor memory of the present invention has the following features. A plurality of conductive lines (wires) is formed at neighboring first and second wiring regions to connect a memory cell array and a peripheral circuit. Each conductive line is composed of the following line portions. One is a wide line portion on the side of the peripheral circuit. Another is a narrow line portion on the side of the memory cell array. Another is an inclined line portion connected the wide line portion and the narrow line portion. In particular, the inclined line portion has the inclination direction to the narrow line portion on the side of the memory cell array.

The foregoing structure is given, and thereby, variations of a wiring pattern of neighboring wiring regions are made small without enlarging the occupied area of the wiring region.

This serves to prevent variations of a drive current resulting from variations of the wiring pattern of lines connecting the memory cell array and the peripheral circuit. Thus, the operation of the semiconductor memory can be stabilized.

2. Embodiments (1) First Embodiment

This embodiment relates to the case where the wiring layout of the conductive line of the present invention is applied to a NAND-type flash memory.

The present invention is not limited to the NAND-type flash memory. The present invention is applicable to a wiring layout of a semiconductor memory such as a dynamic random access memory (DRAM) or a Nor-type flash memory having a wiring layout of a conductive line including an inclined line portion.

(a) Configuration

Figure 1:
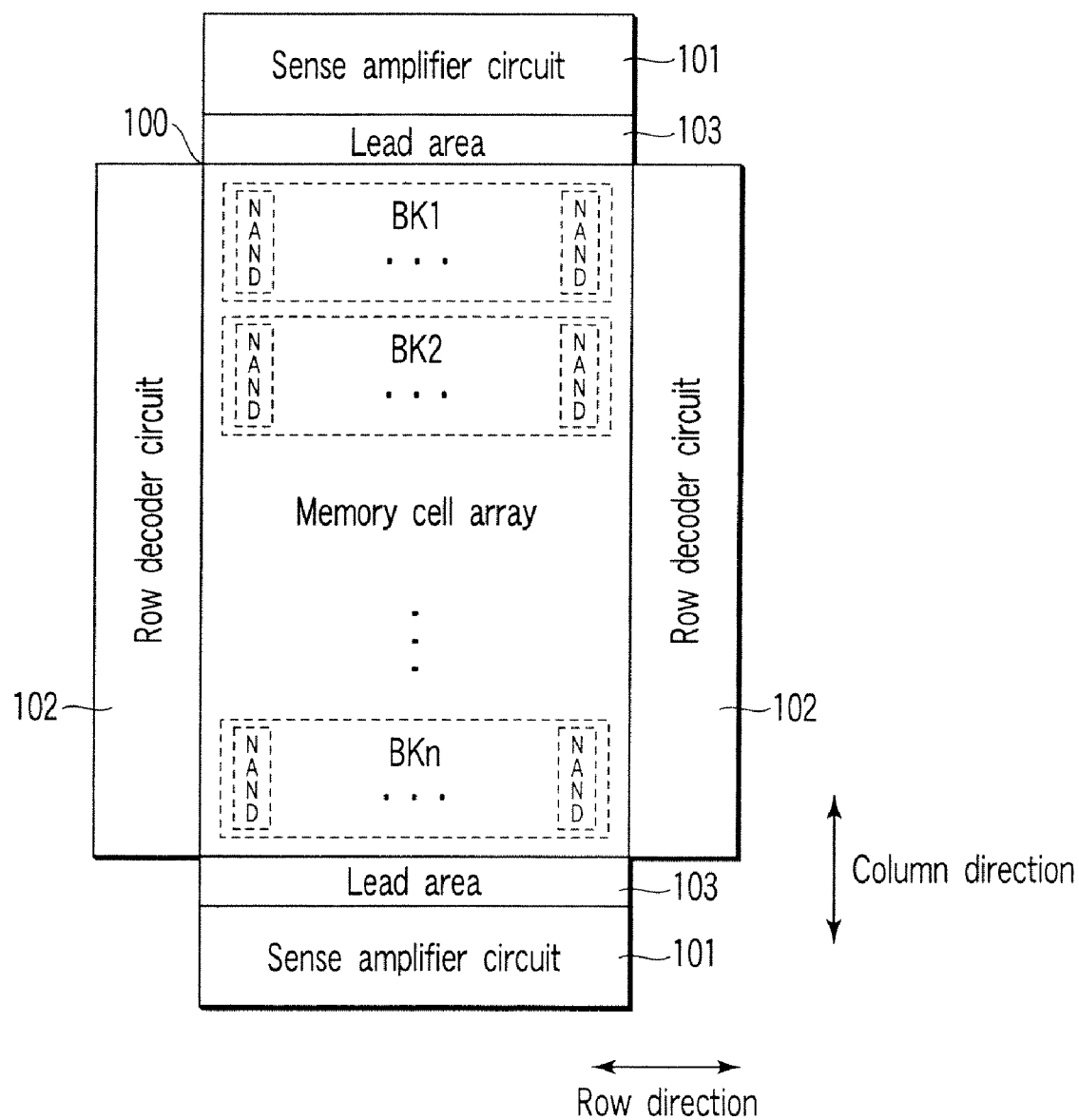
FIG. 1 is a view showing the layout of a NAND type flash memory.

FIG. 1 is a view showing the layout of a memory cell array and a peripheral circuit of a NAND-type flash memory according to the present invention.

The NAND-type flash memory is provided with a memory cell array 100. The memory cell array 100 is composed of several blocks BK1, BK2 . . . BKn. The block each comprises several NAND cell units.

The memory cell array 100 is formed according to fine feature size to integrate the NAND cell unit. Thus, a line pitch of the memory cell array arranged along the NAND cell unit is reduced, and also, the wiring becomes narrow. The memory cell array 100 is divided into a plurality of wiring regions, each wiring region is controlled independently. Since the access control is performed based on each divided wiring region, the divisional control method increases the operating speed of the semiconductor memory device.

The peripheral circuit comprises a control circuit provided in the column direction of the memory cell array 100 and a control circuit provided in the row direction thereof. In this embodiment, the control circuit denotes sense amplifier circuit 101 and row decoder circuit 102.

The sense amplifier circuit 101 is arrayed in the column direction via a lead area 103. A conductive line connects the memory cell array 100 and the sense amplifier circuit 101. The conductive line includes a bit line and lead line. Moreover, the row decoder circuit 102 is arrayed in the row direction perpendicular to the column direction. A word line connects the memory cell array 100 and the row decoder circuit 102.

The foregoing sense amplifier circuit 101 and row decoder circuit 102 are formed according to a feature size larger than the memory cell array 100. Thus, processing is easy, and a large line pitch (line interval) is secured; therefore, the line width on the side of the peripheral circuit is increased.

As described above, the line pitch is different between the memory cell array and the peripheral circuit. For this reason, a lead line portion is interposed between the memory cell array and the peripheral circuit. The lead line portion serves to convert the line pitch of the conductive lines.

This embodiment relates to a wiring layout of the conductive lines including bit line portions and lead line portions. The first embodiment is applicable to a lead portion for converting the line pitch of a word line. The lead line portion may be interposed between the memory cell array and the row decoder circuit as a peripheral circuit.

Figure 2:
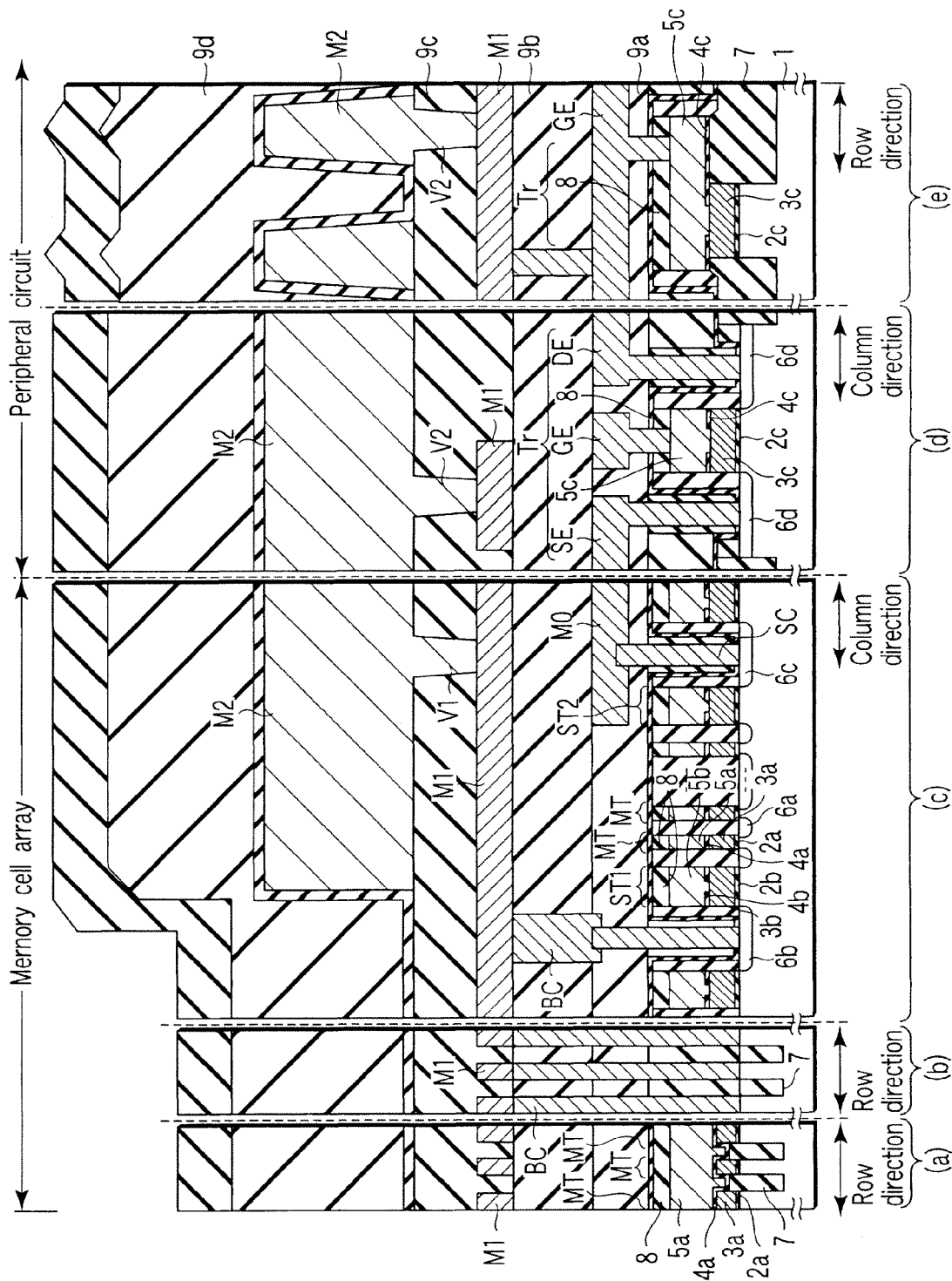
FIG. 2 is a cross-sectional view showing a memory cell array region and a peripheral circuit region.

FIG. 2 shows the sectional structure of memory cell array and peripheral circuit in column and row directions. In FIG. 2, the sense amplifier circuit is given as an example of the peripheral circuit.

FIG. 2(a) to (c) shows the sectional structure in the channel length direction (column direction) of the memory cell array and the channel width direction (row direction) thereof.

The memory cell array comprises several NAND cell units. The NAND cell unit is each composed of memory cell transistor MT and select transistor ST.

The memory cell transistor MT is formed according to minimum feature size for integration.

The memory cell transistor MT is formed with a floating gate electrode 3a on a gate insulating film (tunnel oxide film) 2a. A control gate electrode 5a is formed on the floating gate electrode 3a via an intermediate insulating film 4a. Namely, the memory cell transistor MT is a stacked gate structure transistor.

The control gate electrode 5a functions as a word line, and is connected to the row decoder circuit arrayed in the row direction.

FIG. 2(b) shows a cross section of the memory cell array in the channel width direction. As shown in FIG. 2(b), the floating gate electrode 3a of the memory cell transistors adjacent to the row direction is isolated via an isolation insulating film 7 having a STI (Shallow Trench Isolation) structure. In order to improve a coupling ratio of the memory cell transistor, the control gate electrode 5a has a structure of covering the side of the floating gate electrode 3a in the channel width direction via the intermediate insulating film 4a.

In general select transistors ST1 and ST2 are formed at the same time with the memory cell transistor MT. Therefore, the gate structure is a stacked gate structure. Thus, first and second gate electrodes 3b and 5b are connected via an opening formed in the intermediate insulating film 4b. The first gate electrode 3b is formed at the same time with the floating gate electrode 3a, and the second gate electrode 5b is formed at the same time with the control gate electrode 5a.

Memory cell transistor MT and select transistor ST adjacent to the column direction share a diffusion layer 6a functioning as a source/drain layer.

A first metal layer M1 is connected with the select transistor ST1 via a bit line contact BC and diffusion layer 6b functioning as a source/drain layer.

A intermediate metal layer M0 used as a source line is connected with the select transistor ST2 via source line contact SC and diffusion layer 6c functioning as a source/drain layer.

A cap layer 8 is further formed on the control gate electrode 5a of the memory cell transistor MT and the second gate electrode 5c of the select transistor ST.

FIG. 2(b) is a cross-sectional view showing the bit line contact BC in the row direction. As depicted in FIG. 2(b), the bit line contact BC is formed according to the same feature size as the memory cell transistor. Thus, the first metal layer M1 on the side of the memory cell array connected to the bit line contact BC is also formed according to feature size of the memory cell transistor. For this reason, a second metal layer M2 formed on the upper layer of the memory cell array is formed according to the same feature size as the first metal layer M1.

FIGS. 2(d) and (e) are views showing sense amplifier circuit and a lead portion of the conductive line. The lower layer of FIGS. 2(d) and (e) shows the sectional structure of one peripheral circuit transistor Tr. The upper layer of FIGS. 2(d) and (e) shows a conductive line (lead line portion) on the side of the sense amplifier circuit. The conductive line (lead line portion) on the side of the sense amplifier circuit is formed having a wide line pitch.

In general, the peripheral circuit transistor Tr is formed in the same process as the memory cell array. Thus, a gate electrode formed on a gate insulating film 2c is given as a stack structure gate electrode. First and second gate electrodes 3c and 5c are connected via an opening formed in an intermediate insulating film 4c. The first gate electrode 3c is formed at the same time with the floating gate electrode 3a. The second gate electrode 5c is formed at the same time with the control gate electrode 5a.

Moreover, a cap layer 8 is formed on the second gate electrode 5c.

Source electrode SE and drain electrode DE are each connected to a diffusion layer 6d functioning as a source/drain layer of the peripheral circuit transistor.

Gate electrodes 3c and 5c of the peripheral circuit transistor Tr is connected via a lead gate electrode GE. The lead gate electrode GE is connected with the first metal layer M1 via the contact formed in an insulating layer 9b.

The peripheral circuit transistor Tr is formed at an area having an easy design rule. Thus, the peripheral circuit transistor Tr is formed according to larger feature size compared with memory cell transistor MT and select transistor ST.

The lower layer of the conductive line (lead portion) is not always formed with the peripheral circuit transistor shown in FIG. 2. In this case, an area comprising insulating layer only may be given.

The memory cell array and the sense amplifier circuit are connected via a conductive line having backing wiring structure.

For this reason, the bit line of the NAND type flash memory shown in this embodiment comprises first and second metal layers M1 and M2. For example, the first and second metal layers M1 and M2 are formed of metal material such as aluminum, copper.

The second metal layer M2 is connected with the first metal layer M1 via contacts V1 and V2 formed in an insulating layer 9c, and thereby, the memory cell array and the peripheral circuit are connected.

An insulating layer 9d is formed to cover the entire surface of memory cell array and peripheral circuit.

As described above, the line width of the second metal layer is set narrow on the side of the memory cell array while being set wide on the side of the sense amplifier circuit. Thus, using the lead line portion, the line pitch is converted to connect the memory cell array and the sense amplifier circuit.

The layout for converting the line pitch between the memory cell array and the sense amplifier circuit will be hereinafter described.

(b) Wiring Layout of Conductive Line

Figure 3A:
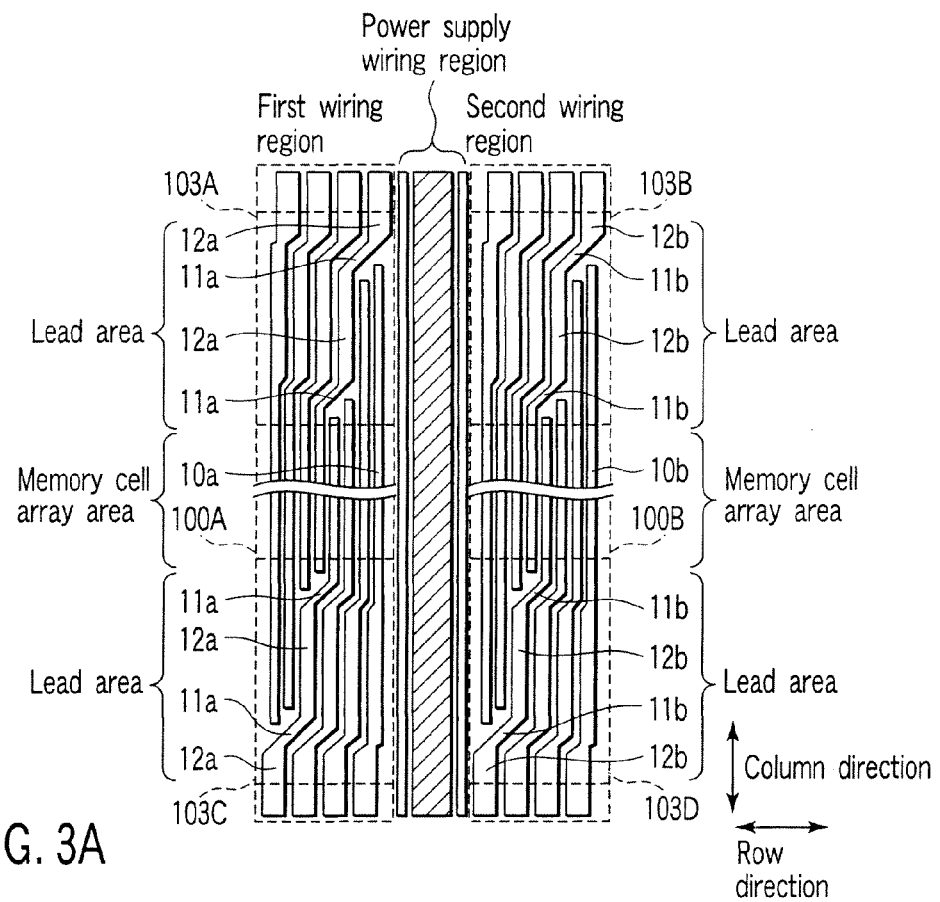
FIG. 3A is a view showing one example of a wiring layout of a conductive line according to a first embodiment.
Figure 3B:
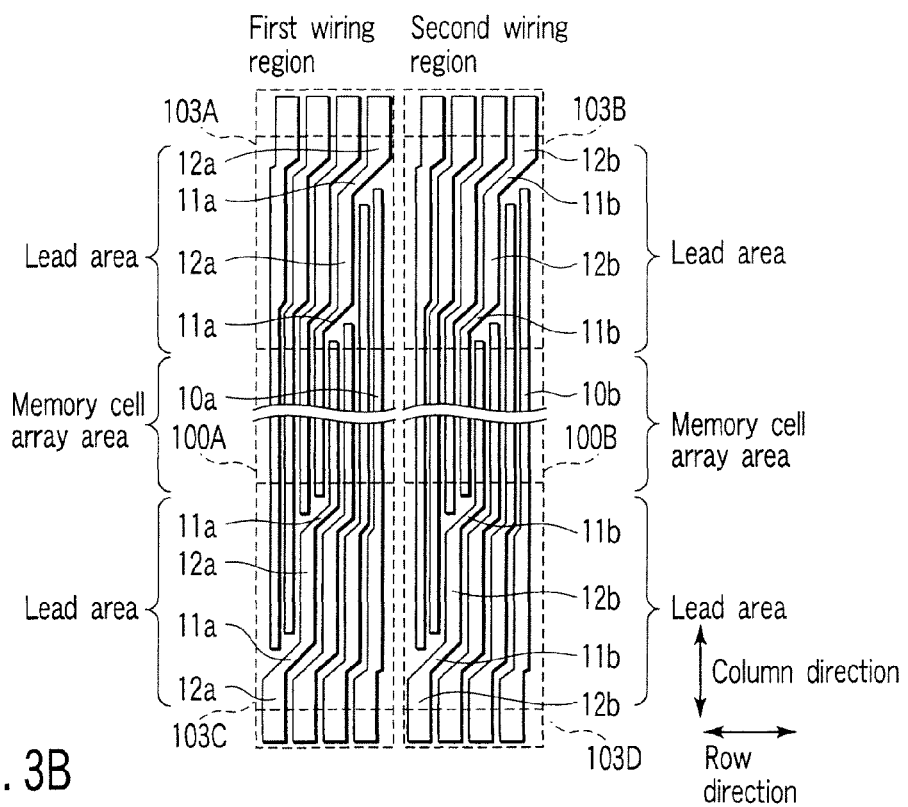
FIG. 3B is a view showing one example of a wiring layout of a conductive line according to a first embodiment.
Figure 4:
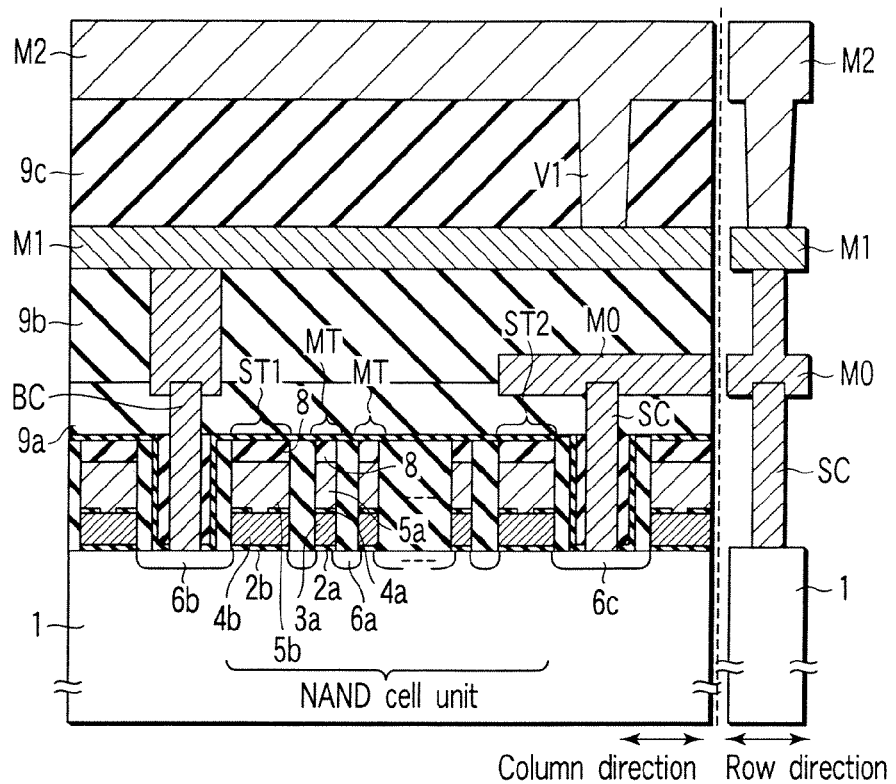
FIG. 4 is a cross-sectional view showing a NAND cell unit region of the memory cell array shown in FIG. 3.

FIG. 3A and FIG. 3B are views showing the layout of a plurality of conductive lines converting a line pitch (interval) and a line width between the bit line portion and the lead line portion. FIG. 4 is a partially cross-sectional view showing a NAND cell unit formed in the memory cell array region shown in FIG. 3A and FIG. 3B in the column direction (channel length direction). In FIG. 4, the same reference numerals are used to designate the same members as FIG. 2, and the explanation is omitted.

As illustrated in FIG. 3A, first and second wiring regions are adjacently formed at right and left via a power supply wiring region. These first and second wiring regions are designed to have the same wiring layout. The memory cell array areas are each formed in the center the first and second wiring regions.

In the example shown in FIG. 3A, four areas 103A, 103B, 103C and 103D are formed in the first and second wiring regions. In the first wiring regions, the lead areas 103A, 103C are located adjacent to one end or the other end of a memory cell array area 10A, respectively. In the second wiring region, the lead areas 103B, 103D are also located adjacent to at one end or the other end of a memory cell array area 100B, respectively. Furthermore, lead area 103B located adjacent to the lead area 103A and lead area 103D located adjacent to the lead area 103C.

The power supply wiring region is composed of power supply line and ground line. In this case, the region may be used as a dummy region without forming lines. Or, as illustrated in FIG. 3B, the first and second wiring regions are designed so that they are directly adjacent to each other without power supply wiring region to have the same wiring layout.

The first and second wiring regions are each composed of eight (8) conductive lines. Each conductive line located in the first wiring region is composed of a first portion 10a as a bit line, a pair of first inclined line portions 11a, and a pair of first lead line portions 12a. And each conductive line located in the second wiring region is composed of a second portion 10b as a bit line, a pair of second inclined line portions 11b, and a pair of second lead line portions 12b. In the conductive line, the line pitch of the first portion (bit line portion) is converted to be stepwise widened.

Eight conductive lines located in the first and second wiring regions are divided into two kinds of sets, respectively. Lead line portions and inclined line portions of a right half set are located in a lower side lead area. Lead line portions and inclined line portion of a left half set are located in an upper side lead area.

The conductive line formed in this embodiment is equivalent to the second metal layer M2 shown in FIG. 2 or FIG. 4. Moreover, the conductive line is not limited to the backing wiring structure. Line pitch conversion is made with respect to the first metal layer M1 to connect the memory cell array and the peripheral circuit.

The memory cell array area 100A, 100B is formed according to minimum feature size for integration. Thus, first and second portions 10a and 10b formed on the upper layer of the memory cell array area 100A, 100B are formed at the line pitch having the approximately same feature size of the NAND cell unit as a bit lines. First and second portions 10a, 10b of the conductive lines are extended to the column direction in parallel with a same pitch (interval) and a same width.

The lower layer of the first and second portions 10a and 10b are formed with several NAND cell units. Incidentally, the first and second portions include the first and second metal layers M1 and M2 formed at the same feature size as the memory cell array.

The first and second portions 10a and 10b are connected with the NAND cell unit via the first metal layer M1 and the bit line contact BC to have a backing wiring structure. The metal layer M0 is connected with the diffusion layer 6c functioning as a source/drain region of the select transistor ST2 via a source line contact SC.

In the side of the sense amplifier circuit, the line pitch (interval) and the line width are set wide. Thus, in the conductive line, first and second inclined line portions 11a, 11b and first and second lead line portions 12a, 12b formed in lead area 103A, 103B, 103C and 103d are repeatedly connected. By doing so, the conductive line extend to the column direction while converting the line pitch and the line width of the lead portion.

Figure 5:
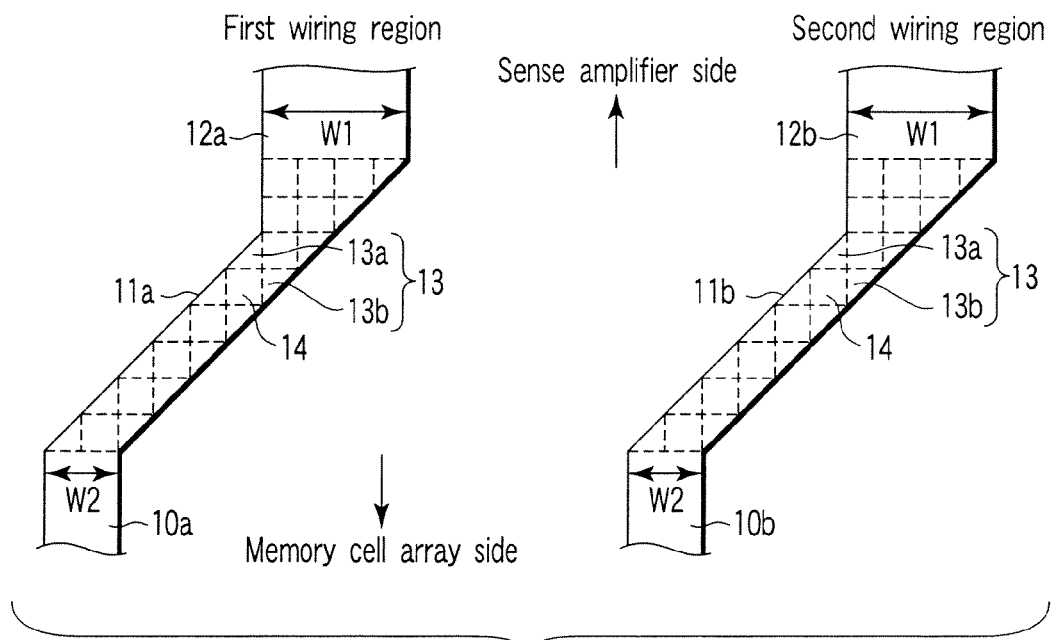
FIG. 5 is a view an electron beam shot pattern for forming an inclined portion of the conductive line shown in FIG. 3.

FIG. 5 is a view showing a pattern of electron beam shot (hereinafter, referred to as EB shot) used when forming pattern glass mask of the first and second inclined line portions 11a and 11b formed by a broken line.

On the side of the memory cell array having a small line pitch, a line width W2 of the conductive line (the first and second portions 10a, 10b) becomes small.

On the other hand, on the side of the sense amplifier circuit having a margin in its line pitch, a line width W1 of the conductive line (the lead line portions 12a, 12b) is secured greater than the line width W2.

All first and second inclined line portions 11a and 11b are set at an inclined angle of 45. Here, the inclined angle is defined by the column direction and a direction which an inclined line portion is extended along with a surface of the semiconductor substrate.

The first and second inclined line portions 11a and 11b have the same inclined direction from the sense amplifier side to the memory cell array side.

The conductive line including first and second inclined line portions 11a and 11b is formed in the following manner. In general, the conductive is formed on a wafer using PEP (Photo Engraving Process) based on a glass mask formed into a desired wiring pattern by electron beam exposure.

The wiring pattern of the first and second inclined line portions 11a and 11b are composed of triangular Parts 13a, 13b and rectangular part 14. Triangular Parts 13a and 13b are formed using triangular EB shot when the glass mask is formed by electron beam exposure. The rectangular part 14 is formed using rectangular EB shot.

In this embodiment, the inclined wiring pattern having the same inclination direction is used. Therefore, in the first and second wiring regions, first and second inclined line portions 11a and 11b are formed combining triangular EB shot 13a and 13b having the same arrangement.

Thus, in the first and second inclined line portions 11a and 11b, no difference between right and left occurs in the wiring layout.

In neighboring wiring regions, the wiring layout having inclined lines having the same inclined direction is used. By doing so, the difference between right and left in the inclined lines of the neighboring wiring regions becomes small. Therefore, this serves to reduce variations of wiring pattern of the first and second wiring region.

According to the foregoing wiring layout, there is no need of taking large margin for preventing wiring variations. And also, the occupied area of the wiring layout on a chip has no need to be increased.

Moreover, variations become small in the wiring pattern, so that variations of drive current carrying the conductive lines of memory cell array and peripheral circuit is prevented. Therefore, the semiconductor memory is stably operated.

The present invention is not limited to the wiring layout which includes the bit line; in this case, the present invention is applicable to a wiring layout which includes a word line.

If the present invention is applied to the word line, lines extend to the row direction. Thus, the first and second wiring regions have an up and down neighboring layout. Therefore, a wiring layout is formed such that the line pitch is increased from the memory cell array toward the row decoder circuit.

(2) Second Embodiment

The wiring layout of the conductive line is not limited to FIG. 3. For example, a wiring layout shown in FIG. 6 may be given.

Like the first embodiment, first and second wiring regions are arranged right and left a power supply region, and have the same wiring layout. A line pitch of the conductive line is set in a manner that a line width W1 on the side of the sense amplifier circuit is greater than a line width W2 on the side of the memory cell array.

Figure 6:
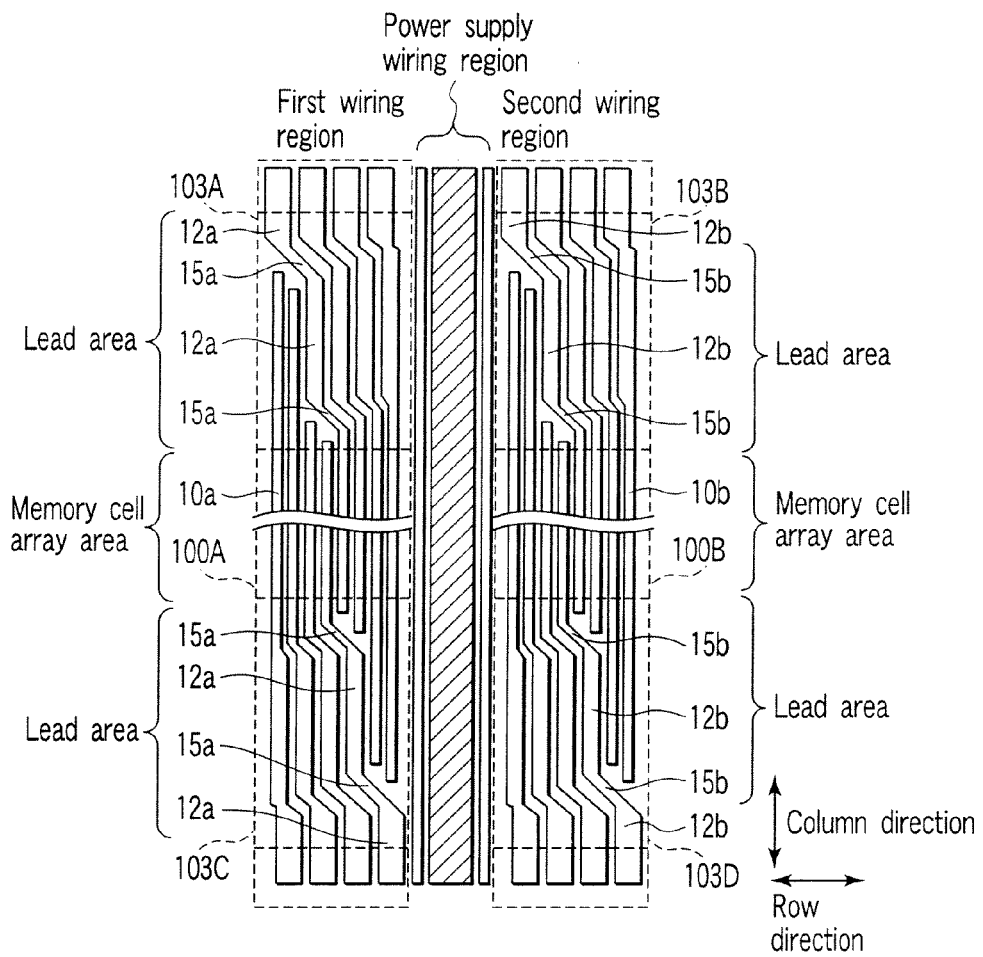
FIG. 6 is a view showing the wiring layout of a conductive line according to a second embodiment.

However, inclined line portions 15a and 15b shown in FIG. 6 are set in a manner that the inclined direction from the sense amplifier circuit side to the memory cell array side becomes reverse to the first embodiment.

In order to obtain the foregoing layout, EB shot for forming the inclined line pattern has need to use EB shot 16. The EB shot 16 becomes right and left symmetry with respect to the EB shot 13 used for the first embodiment.

Figure 7:
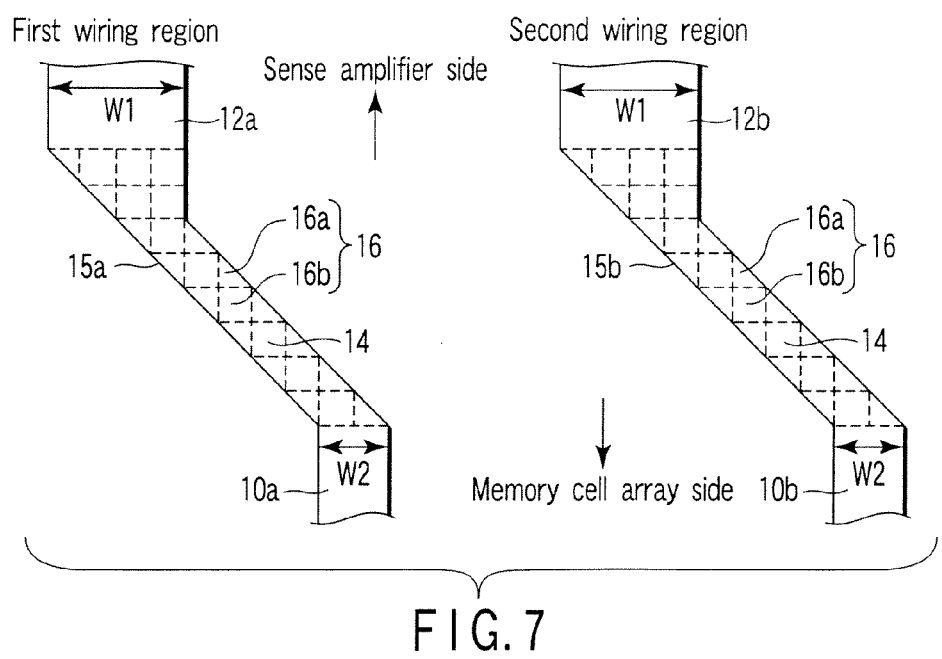
FIG. 7 is a view an electron beam shot pattern for forming an inclined portion of the conductive line shown in FIG. 6.

In this embodiment, the inclined line portions 15a and 15b of the first and second wiring regions shown in FIG. 6 have the same inclined direction to the memory cell array. Thus, as seen from FIG. 7, a glass mask of the inclined wiring pattern of the first and second wiring regions is formed using the same EB shot 16.

Therefore, when the glass mask of the wiring pattern is formed, it is possible to prevent variations of mask pattern resulting from the difference between right and left by the triangular EB shot. Thus, variations of lines, that is, inclined wiring pattern formed on a wafer using the glass mask is prevented in the neighboring wiring regions.

As a result, the same effect as the first embodiment is obtained.

3. Application Example

The method of assigning physical address when the wiring layout described in the first and second embodiments is applied to a conductive line which has bit line of a NAND-type flash memory will be hereinafter explained.

The NAND-type flash memory to which the first and second embodiments are applied is driven according to bit line sealed sense system.

According to the bit line sealed system, one sense amplifier circuit shares two bit lines. Thus, as shown in FIG. 8, the column-direction physical address is assigned to a bit line pair A1 to A4 comprising two bit lines of the first wiring region and a bit line pair B1 to B4 comprising two bit line of the second wiring region.

Figure 8:
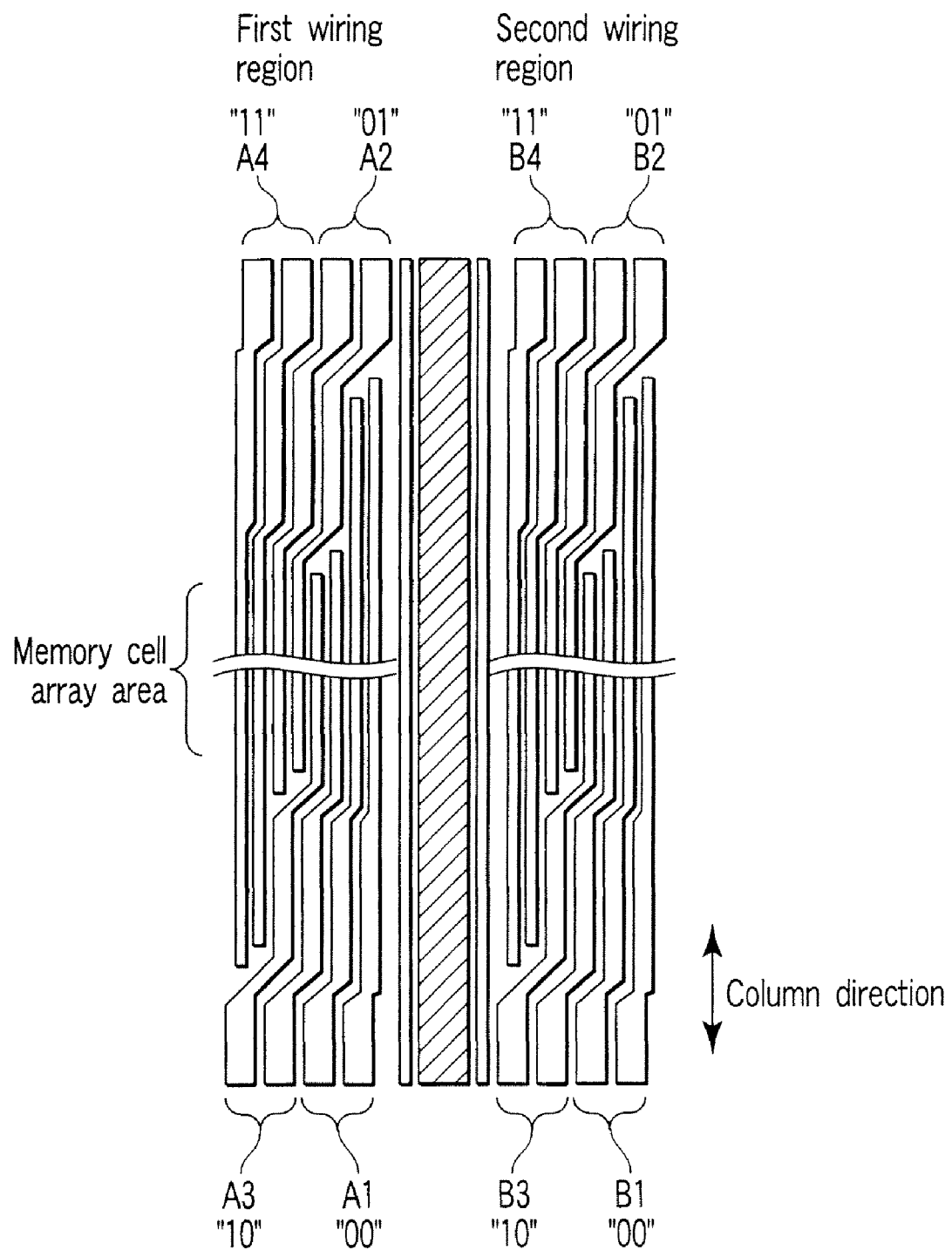
FIG. 8 is a view to explain physical address settings with respect to the wiring layout.

For example, when bit line physical address is set as low two digits "00", "01", "10" and "11", the physical address corresponding to the bit line pairs A1 to A4 and B1 to B4 is assign as shown in FIG. 8.

Namely, the first and second wiring regions are designed to have the same layout. Therefore, the assignment sequence (decoder layout) of the physical address of the NAND cell unit is designed so that bit lines A1 to A4 of the first wiring region and bit lines B1 to B4 of the second wiring region are the same.

4. Others

According to the present invention, the shape of lines is stably formed without increasing the occupied area of the wiring region; therefore, a drive current carrying the lines is stabilized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising: a semiconductor substrate including a first wiring region having a first memory cell array area and a first lead area located adjacent to the first memory cell array area, and a second wiring region located adjacent to the first wiring region, the second wiring region having a second memory cell array area located adjacent to the first memory cell array area and a second lead area located adjacent to the first lead area;

a plurality of first lines located in the first wiring region, each first line located from the first memory cell array area to the first lead area, each first line including a first portion located in the first memory cell array area, a first lead portion located in the first lead area and a first inclined portion located in the first lead area, the first inclined portion connecting the first portion and the first lead portion, respectively; and a plurality of second lines located in the second wiring region, each second line located from the second memory cell array area to the second lead area, each second line including a second portion located in the second memory cell array area, a second lead portion located in the second lead area and a second inclined portion located in the second lead area, the second inclined portion connecting the second portion and the second lead portion, respectively, wherein the first portions are located in parallel with a first pitch, the second portions are located in parallel with a second pitch which is the same as the first pitch, the first lead portions are located with a third pitch which is larger than the first pitch, the second lead portions are located with a fourth pitch which is the same as third pitch, the first inclined portions extend in a first direction at a predetermined angle to the first portion, and the second inclined portions extend in a second direction which is the same as the first direction, the plurality of first lines has a same layout to the plurality of second lines in the first and second directions, the plurality of first lines has a same layout to the plurality of second lines in a third direction which is perpendicular to the first and second direction, and in the plurality of second lines, half of the second portions positioned in a first memory cell array area side bend in a direction away from the first memory cell array area side, and remaining second portions positioned in the second memory cell array area opposite the first memory cell array area side bend toward the first memory cell array area.

2. The semiconductor memory device according to claim 1, wherein the first and second portions are bit lines.

3. The semiconductor memory device according to claim 2 further comprising sense amplifiers connected to the first and second lead portions.

4. The semiconductor memory device according to claim 1, wherein each of the first and second inclined portions is composed of a rectangular part and a triangular part.

5. The semiconductor memory device according to claim 1, wherein the predetermined angle is 45°.

6. The semiconductor memory device according to claim 1 further comprising a power supply wiring region located between the first and second wiring regions and a power supply line is located in the power supply wiring region.

7. The semiconductor memory device according to claim 1, wherein the first and the second lines each have the same physical address assignment sequence.

8. The semiconductor memory device according to claim 1, wherein the first and second memory cell array areas include a plurality of non-volatile memory cells.

* * * * *